(12) United States Patent
Ajit et al.

(10) Patent No.: US 6,313,672 B1
(45) Date of Patent: *Nov. 6, 2001

(54) OVER-VOLTAGE TOLERANT INTEGRATED CIRCUIT I/O BUFFER

(75) Inventors: Janardhanan S. Ajit, Sunnyvale; Hung Pham Le, San Jose, both of CA (US)

(73) Assignee: Exar Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/464,374

(22) Filed: Dec. 15, 1999

(51) Int. Cl.[7] ............................. H03B 1/00; H03K 3/00
(52) U.S. Cl. ..................... 327/112; 327/534; 327/537; 327/391; 326/87; 326/27
(58) Field of Search ........................ 327/108–112, 170, 327/375, 389, 391, 534, 537; 326/26, 27, 17, 57, 58, 83, 86, 87

(56) References Cited

U.S. PATENT DOCUMENTS

| | | | |
|---|---|---|---|
| 5,467,031 | * 11/1995 | Nguyen et al. | 327/534 |
| 5,635,861 | * 6/1997 | Chan et al. | 326/27 |
| 5,719,525 | * 2/1998 | Khoury | 327/537 |
| 5,801,569 | * 9/1998 | Pinkham | 327/333 |
| 5,831,449 | * 11/1998 | Shigehara et al. | 326/27 |
| 5,850,159 | * 12/1998 | Chow et al. | 326/83 |
| 5,933,025 | * 8/1999 | Nance et al. | 326/83 |
| 5,939,936 | * 8/1999 | Beiley et al. | 327/534 |
| 6,028,450 | * 2/2000 | Nance | 326/83 |
| 6,094,086 | * 7/2000 | Chow | 327/108 |
| 6,130,563 | * 10/2000 | Pilling et al. | 327/112 |

* cited by examiner

*Primary Examiner*—Terry D. Cunningham
*Assistant Examiner*—Long Nguyen
(74) *Attorney, Agent, or Firm*—Townsend and Townsend and Crew LLP

(57) ABSTRACT

The present invention provides a buffer circuit that can tolerate over-voltage, and a method for protecting buffer circuits from over-voltage. Specifically, the buffer circuit can operate at lower voltages (e.g., 3.3 V) and interface with other circuits that operate at higher voltages (e.g., 5 V). In a preferred embodiment, the buffer circuit has a pre-driver circuit having a pull-up circuit coupled to an interface node via a PMOS switch transistor. The pre-driver biasing circuit is configured to decouple the pull-up circuit from the input voltage source when an input voltage at the interface node exceeds the VDD voltage by a threshold voltage. The buffer circuit has a first biasing transistor that ties an N-well of the integrated circuit to the VDD voltage source when a control node of a PMOS driver transistor is in a first logic state, and a second biasing transistor that ties the N-well to the VDD voltage source when the control node of the PMOS driver transistor is in a second logic state.

8 Claims, 6 Drawing Sheets

OVER-VOLTAGE TOLERANT INTEGRATED CIRCUIT I/O BUFFER

RELATED APPLICATIONS

This application is related to another application of the same inventors, filed even date herewith, entitled "Low-Power Integrated Circuit I/O Buffer," application Ser. No. 09/464357, [010262-011600US].

BACKGROUND OF THE INVENTION

The present invention relates to the field of integrated circuit products, and more specifically to a buffer circuit that is tolerant to over-voltage. The invention also relates to a method for protecting buffer circuits from over-voltage.

Generally, gate-oxides in 0.35 $\mu$m technology can withstand a maximum of 3.6 V Specifically, the potential difference between gate-to-source, gate-to-drain, and gate-to-substrate should not exceed 3.6 V If such potential differences exceed 3.6 V, electrical problems, such as current leakage, can occur. For example, a typical buffer circuit designed with CMOS digital integrated technology has driver PMOS transistors coupled in series between a supply-voltage VDD and an input/output node. Over-voltage can occur when a voltage at its input/output (I/O) node is higher than the I/O buffer supply-voltage VDD. For instance, when a 5 V input voltage appears at an I/O node, and VDD is 3.3 V (typical value), a driver PMOS transistor can turn on if the source-to-gate voltage is greater than the PMOS threshold voltage. Also, when a 5 V input voltage appears at the I/O node, a P+/N-well diode from the I/O node to an N-well underneath the PMOS transistors turns on. As a result, the diode is forward biased and current leaks from the I/O node to the N-well.

A need therefore remains for a simple and reliable buffer circuit that is tolerant to over-voltage, and for a reliable method for protecting buffer circuits from over-voltage. Such a circuit and method should thus prevent problems such as high leakage and gate-oxide damage. Also, such a circuit and method should be cost effective and require little space.

SUMMARY OF THE INVENTION

The present invention achieves these benefits in the context of known integrated circuit technology and known techniques in the art.

The present invention provides a buffer circuit that can tolerate over-voltage, and a method for protecting buffer circuits from over-voltage. Specifically, the buffer circuit can operate at lower voltages (e.g., 3.3 V) and interface with other circuits that operate at higher voltages (e.g., 5 V) at an interface node. In a preferred embodiment, the buffer circuit has a driver PMOS transistor, and a pre-driver circuit having a pull-up circuit coupled to the interface node via a PMOS switch transistor and a first PMOS pass transistor. The pre-driver biasing circuit is configured to decouple the pull-up circuit from the interface node when an input voltage at the interface node exceeds the VDD voltage by a PMOS threshold voltage. The buffer circuit has a first biasing transistor that ties an N-well of the integrated circuit to the VDD voltage source when a control node of a PMOS driver transistor is in a first logic state, and a second biasing transistor that ties the N-well to the VDD voltage source when the control node of the PMOS driver transistor is in a second logic state. In addition, the buffer circuit has a third biasing transistor that ties the N-well to the interface node when the input voltage at the interface node exceeds the VDD voltage by a PMOS threshold voltage.

In a preferred embodiment, the buffer circuit also has a second pre-driver circuit and a second driver circuit. The first and second pre-driver circuits are configured to provide control signals to a first driver circuit and a second driver circuit, respectively.

The pre-driver biasing circuit further includes a second PMOS pass transistor connected between the control node of the PMOS switch transistor and the control node of the PMOS driver transistor. The pre-driver biasing circuit further includes a third pass transistor coupled to the control node of the PMOS switch transistor, a control node of the third pass transistor being coupled to the VDD voltage source; and a first pre-driver biasing transistor coupled between the third pass transistor and a VSS voltage source, a control node of the first pre-driver biasing transistor being configured to receive an enable signal; and a second pre-driver biasing transistor coupled in parallel to the first pre-driver biasing transistor, a control node of the second pre-driver biasing transistor being configured to receive a second input signal.

Yet in another embodiment, the present invention is a buffer circuit including a first feedback circuit and a second feedback circuit cross-coupled between the first and second pre-driver circuits. The first feedback circuit can include an NMOS transistor having a drain node coupled to a drain of the switch transistor, and a control node coupled to the VDD voltage source; an inverter having an input coupled to a source node of the NMOS transistor; and a PMOS transistor having a source node coupled to the VDD voltage source, a drain node coupled to the input of the inverter, and a control node coupled to an output of the inverter; wherein the output of the inverter is coupled to the second pre-driver circuit.

One advantage of the present invention is that it when a high-voltage is applied to the I/O node, leakage current from I/O node to VDD is minimized. Another advantage of this design is that only one big driver PMOS is used. This saves about 4 times the area compared to that when using the alternative approach for high-voltage protection, that is, when two PMOS transistors are used in series. Another advantage of this design is that the new buffer circuit requires only a single gate-oxide thickness. This results in a significant reduction in fabrication costs and a significant increase in fabrication yield. The present invention accomplishes the above benefits and purposes in an inexpensive, uncomplicated, durable, versatile, and reliable circuit and method, inexpensive to manufacture, and readily suited to the widest possible utilization.

A further understanding of the nature, objects, features, and advantages of the present invention is realized upon consideration of the latter portions of the specification including the accompanying drawings and appended claims.

DESCRIPTION OF THE SPECIFIC EMBODIMENTS

Circuit Overview

Figure 1:
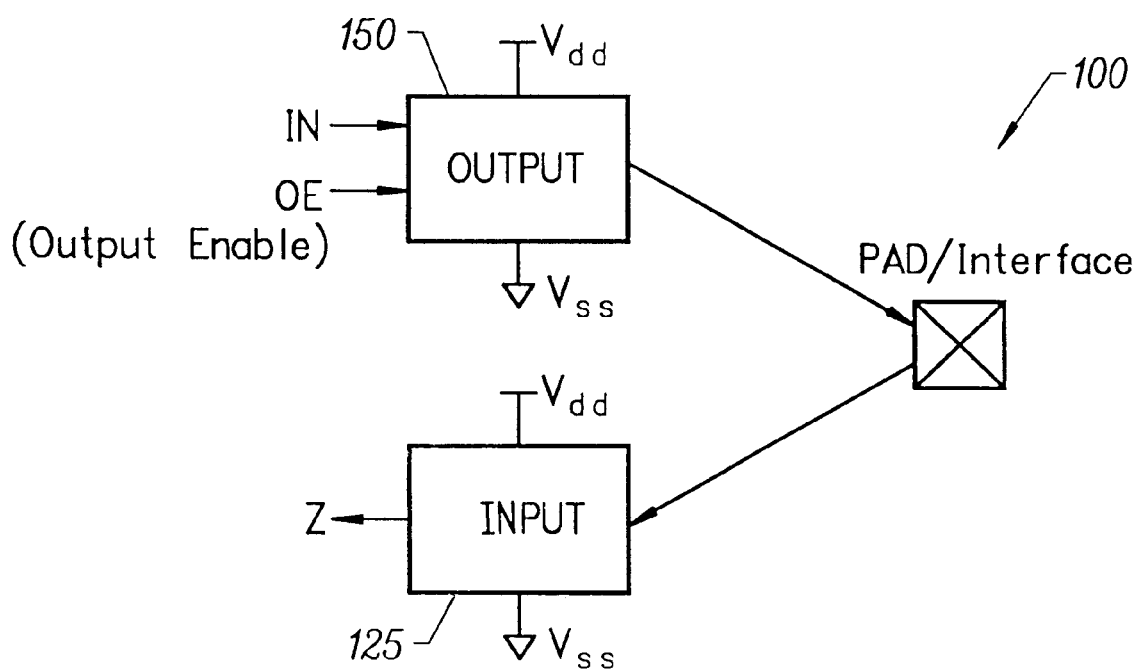
FIG. 1 is a block diagram of an over-voltage tolerant integrated circuit buffer showing an input stage and an output stage.
Figure 2:
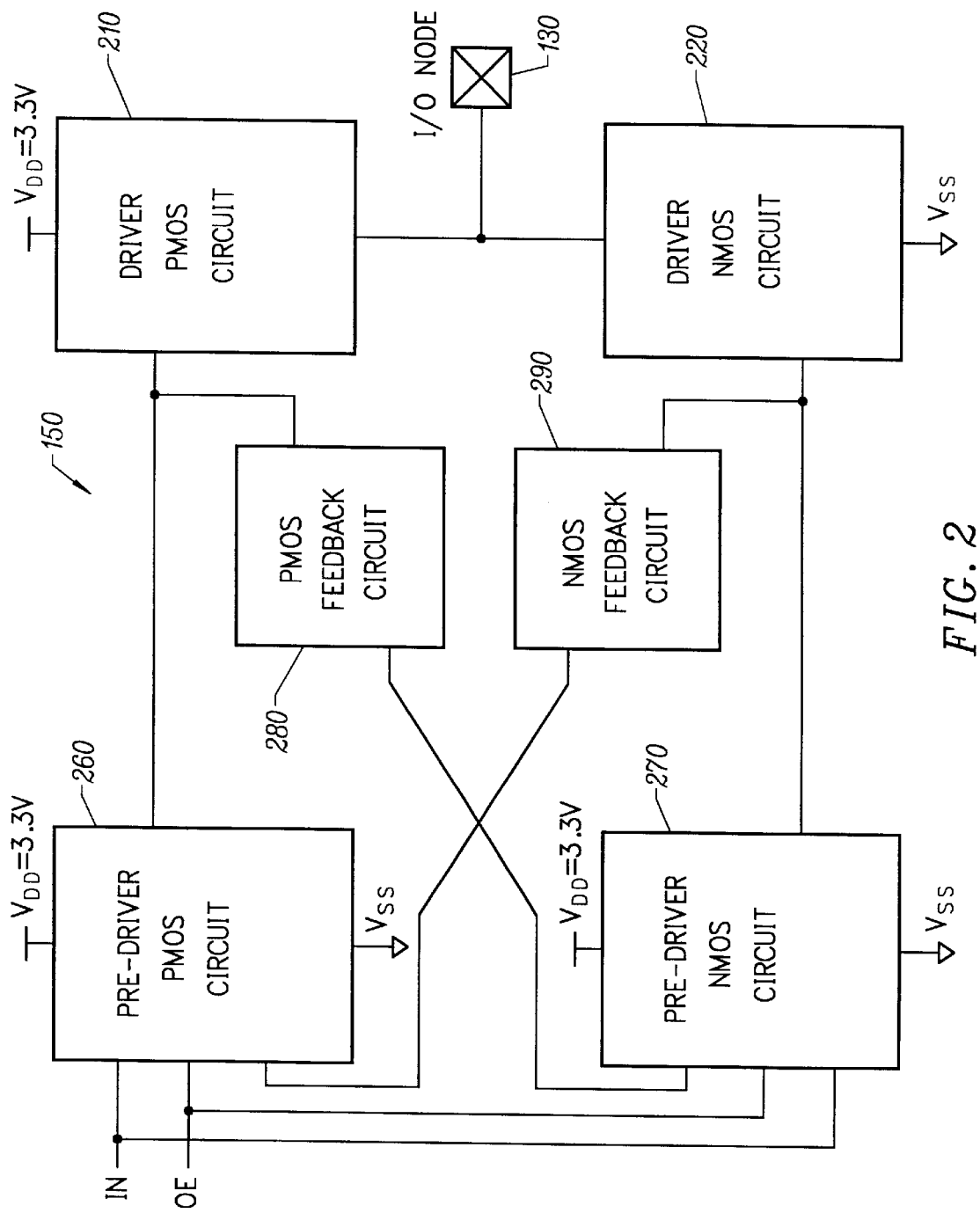
FIG. 2 is a block diagram of the output stage of the over-voltage tolerant integrated circuit buffer of FIG. 1.

FIG. 1 is a block diagram of an over-voltage tolerant integrated circuit buffer 100 showing an input stage 125 and an output stage 150. FIG. 2 is a block diagram of the output stage 150, or buffer circuit 150, of the over-voltage tolerant integrated circuit buffer of FIG. 1. The embodiment shown in FIG. 2 includes a driver PMOS circuit 210 and a driver NMOS circuit 220 operatively coupled to an I/O node 230 to source current to a load (not shown) via I/O node 230, and to sink current from the load, respectively. Driver PMOS circuit 210 couples to a supply voltage, or VDD, and driver NMOS circuit 220 couples to a ground voltage, or VSS. VDD can be designed to be 2 V, 3 V, 4 V, or other voltages. In this specific embodiment, VDD is 3.3 V. Likewise, VSS can be designed to be −0.5 V, 0 V, 0.5 V, or other voltages. In this specific embodiment, VSS is 0 V.

Driver PMOS circuit 210 operatively couples to a pre-driver PMOS circuit 260, and Driver NMOS circuit 220 operatively couples to a pre-driver NMOS circuit 270. Both pre-driver PMOS circuit 260 and pre-driver NMOS circuit 270 couple to VDD and VSS. Also, both pre-driver circuits are configured to receive an input signal IN and an output enable signal OE. Pre-driver PMOS circuit 260 and pre-driver NMOS circuit 270 provide control signals to driver PMOS circuit 210 and driver NMOS circuit 220, respectively. Driver PMOS circuit 210 also operatively couples to pre-driver NMOS circuit 270 via a PMOS feedback circuit 280. Likewise, driver NMOS circuit 270 operatively couples to pre-driver PMOS circuit 260 via an NMOS feedback circuit 290. The feedback circuits ensure that both driver circuits are not conducting simultaneously. Simultaneous conduction of the driver circuits is undesirable, because it increases power dissipation in the circuit.

Still referring to FIG. 2, buffer circuit 150 is described in two modes, input mode (or tri-state mode) and output mode (or normal mode), in this order. Generally, in input mode, buffer circuit 150 receives an output enable signal OE that is at a logic low state. Driver circuits 210 and 220 are configured to turn off, or go into tri-state mode, when output enable signal OE is low. Accordingly, an input signal can pass through the buffer via I/O node 230. A biasing circuit (not shown), integral to buffer circuit 150, regulates the voltage potential-differences between the gates of buffer circuit 150 and corresponding sources, drains, and substrates (not shown). Generally, the biasing circuit maintains such voltage potential-differences to tolerable levels, and particularly, when a buffer circuit 150 is in input mode and a destructively high input voltage exists at I/O node 230. Such a voltage can be 5 V or more. As a result, the biasing circuit (not shown) protects buffer circuit 150 from such high-voltages.

During output mode, the pre-driver circuits 260 and 270 receive an output enable signal OE that is at a logic high state. The driver circuits are configured so that they can turn on when output enable signal OE is high. Accordingly, an output signal can pass through the buffer via the driver circuits.

Figure 3:
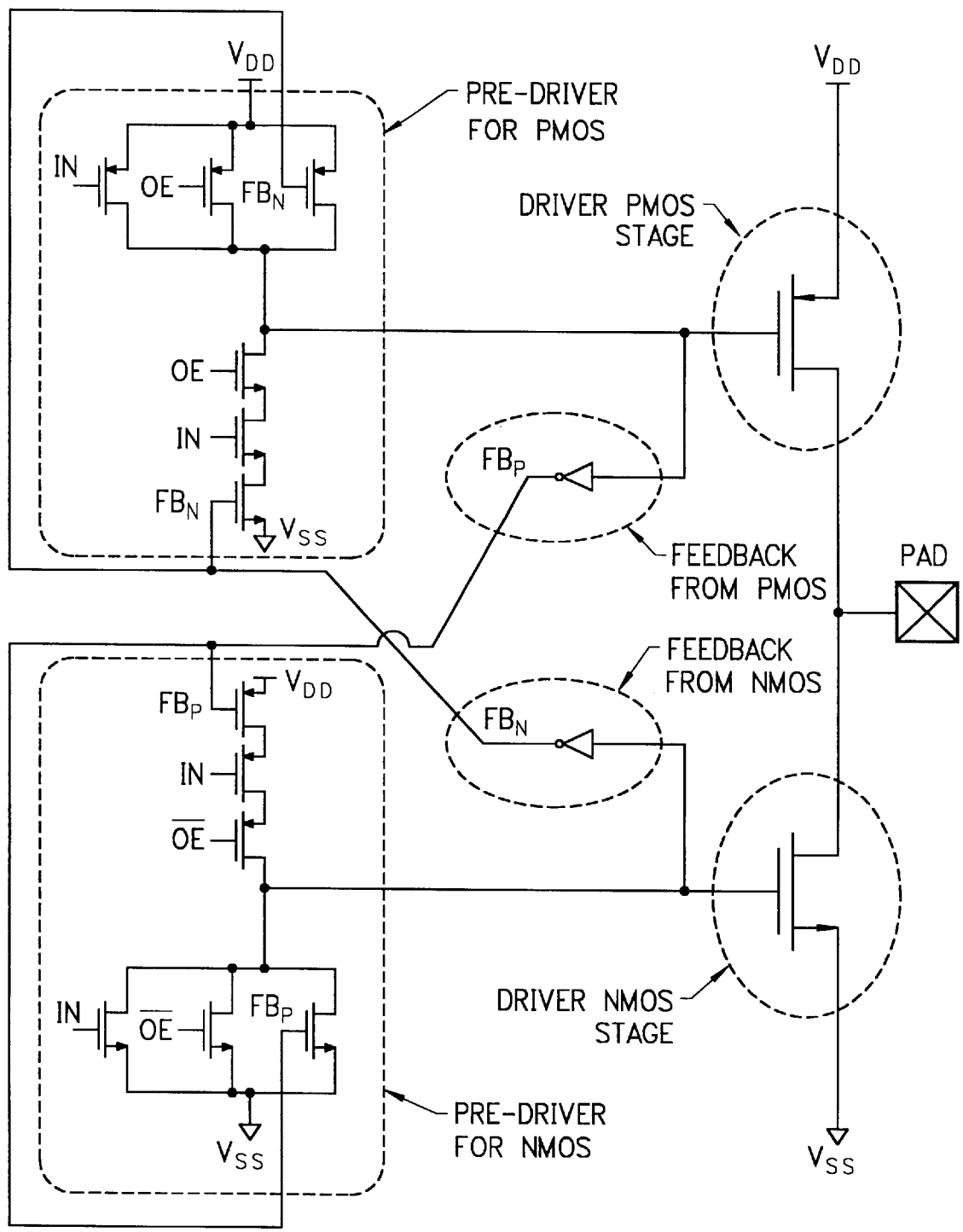
FIG. 3 is a schematic diagram of prior-art including an output stage of an integrated circuit buffer.
Figure 4:
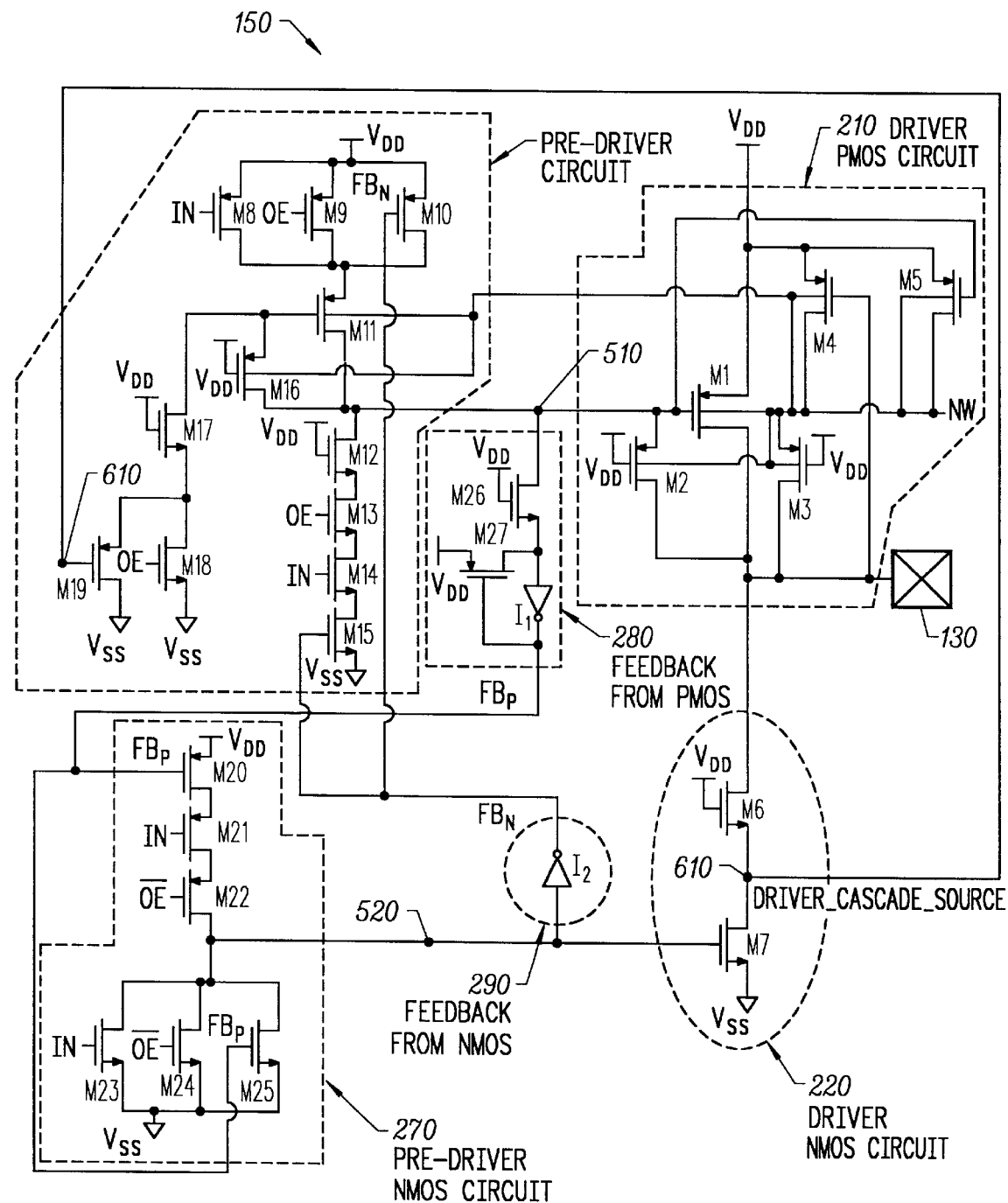
FIG. 4 is a detailed schematic diagram of an embodiment of the output stage of the over-voltage tolerant integrated circuit buffer of FIG. 1, including driver, pre-driver, and feedback circuits.

FIG. 3 is a schematic diagram of prior-art including an output stage of an integrated circuit buffer. This output stage is not over-voltage tolerant. FIG. 4 is a detailed schematic diagram of an embodiment of the new invention of output stage 150, or buffer circuit 150, of the over-voltage tolerant integrated circuit buffer of FIG. 1. Buffer circuit 150 includes several sub-circuits, each of which is described in detail in separate sections below. Buffer circuit 150 includes driver PMOS circuit 210 and a driver NMOS circuit 220. Driver PMOS circuit 210 is first described.

Driver PMOS Stage

Figure 5:
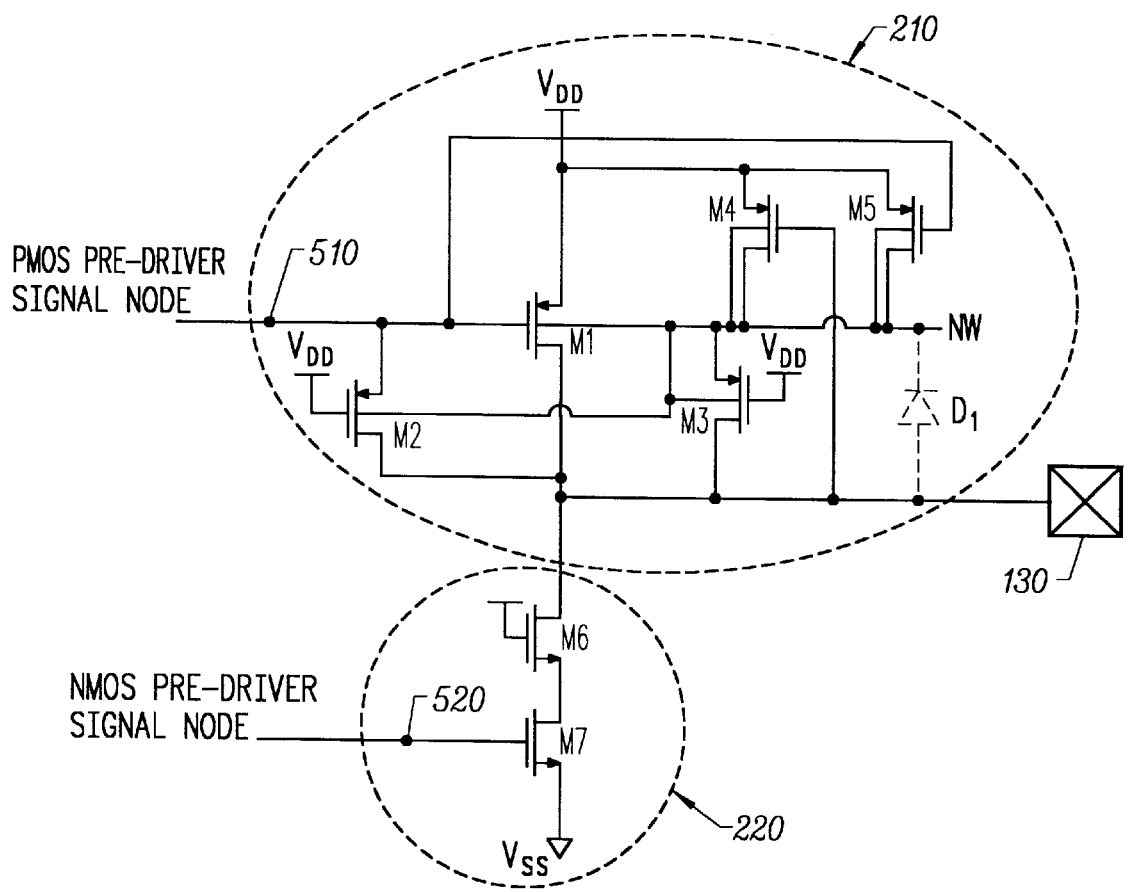
FIG. 5 is a schematic diagram of an embodiment of the driver circuits of the output circuit of FIG. 4.

FIG. 5 is a schematic diagram of an embodiment of the driver circuits of buffer circuit 150. Driver PMOS circuit 210 includes a pull-up circuit which, in this specific embodiment, is a driver PMOS transistor M1. Transistor M1 couples between VDD and I/O node 230 to provide a source current to a load (not shown). The control input, or gate, of transistor M1 couples to a pre-driver PMOS signal node 510 to receive a control signal from pre-driver PMOS circuit 260 (FIG. 3).

Driver PMOS circuit 210 also includes a driver biasing circuit. The driver biasing circuit includes a plurality of transistors coupled to an N-well NW. The transistors of the driver biasing circuit are shown integrated into driver PMOS circuit 210. In this specific embodiment, four PMOS transistors M2, M3, M4 and M5 constitute the driver biasing circuit.

Within the driver biasing circuit, PMOS pass transistor M2 couples between the gate of transistor M1 and I/O node 130 to tie the gate of transistor M1 to the I/O node 130 during high-voltage conditions. The control input of the PMOS pass transistor M2 couples to VDD. A PMOS pass transistor M3 couples between N-well NW and I/O node 130 to tie N-well NW to I/O node 130 during high-voltage conditions. The control input of PMOS transistor M3 is tied to VDD. Transistors M4 and M5 couple in parallel between VDD and N-well NW to tie N-well NW to VDD. The control input of transistor M4 couples to I/O node 130, and the control input of transistor M5 couples to the control input of transistor M1.

In operation, the driver PMOS circuit 210 is described in two modes, input mode (or tri-state mode) and output mode (or normal mode), in this order.

In input mode, driver PMOS 210 circuit is kept off by biasing the gate of transistor M1 to a logic high. A P+/N-well diode D1 (shown in dotted lines) is kept off by biasing N-well NW of driver PMOS circuit 210 to its highest potential. Diode D1 is built into PMOS transistors M1, M2, and M3. During high-voltage conditions, the driver PMOS circuit regulates the voltage potential-differences between its gates to corresponding sources, drains, and substrates. Conditions are characterized as "high-voltage" conditions when the I/O node 130 is subjected to a high-voltage input such as 5 V or some other predetermined level above VDD.

Generally, transistors M2 and M3 bias the gate of driver PMOS transistor M1 and the N-well NW, respectively, to the high-voltage at I/O node 130 when the voltage at I/O node 130 is higher than VDD. Thus, when a high-voltage is applied to I/O node 130, leakage current from I/O node 130 to VDD is minimized. In particular, during such high-voltage conditions, transistor M2 turns-on when the I/O node-to-gate voltage of M2 exceeds its threshold voltage. (Under otherwise normal conditions, transistor M2 is off because its gate is biased to VDD.) As a result of transistor M2 being turned on, the gate of transistor M1 is tied to the high-voltage of I/O node 130. Since the gate of transistor M1 follows the high-voltage at I/O node 130, the high-voltage at I/O node 130 propagates to NMOS and PMOS feedback circuits 280 and 290 (FIG. 2). The significance of this propagation is explained later. During such high voltage conditions, when I/O node 130 is subjected to high-voltages, transistor M3 turns-on when the I/O node-to-gate voltage of M3 exceeds its threshold voltage. As a result, N-well NW is also tied to the high-voltage of the I/O node 130.

In output mode, transistors M4 and M5 bias N-well NW to VDD. This results in minimal swing below VDD thus reducing the possibility of latch-up in this region. In particular, during output mode, either transistor M4 or transistor M5 is on including during output transitions (from logic high to low and vice versa). When I/O node 130 is low, transistor M4 is on. Conversely, and when I/O node 130 is high, due to transistor M1 being on, transistor M5 is on. (The state of transistor M5 follows that of transistor M1 because their gates coupled together). Transistors M4 and M5 are configured to overlap in conduction to assure stability of the voltage at N-well NW.

Driver NMOS Stage

Still referring to FIG. 5, NMOS circuit 220 is now described. Driver NMOS circuit 220 is a pull-down circuit that includes a plurality of transistors. In this specific embodiment, two NMOS transistors M6 and M7 constitute the Driver NMOS circuit 220. Transistors M6 and M7 couple in series between I/O node 130 and VSS to sink current from a load (not shown) via I/O node 130. The control input of transistor M6 couples to VDD. Accordingly, transistor M6 is typically on because its gate is biased to VDD. Transistor M6 acts as a pass transistor and allows only voltages less than VDD-VTN to propagate to transistor M7. (VTN is the threshold voltage of the NMOS transistor.) This assures that the gate-to-drain voltage of both M6 and M7 is equal to or below VDD. The control input of transistor M7 couples to a pre-driver NMOS signal node 520 to receive a control signal from pre-driver NMOS circuit 270 (FIG. 4).

Pre-Driver PMOS Circuit

Figure 6:
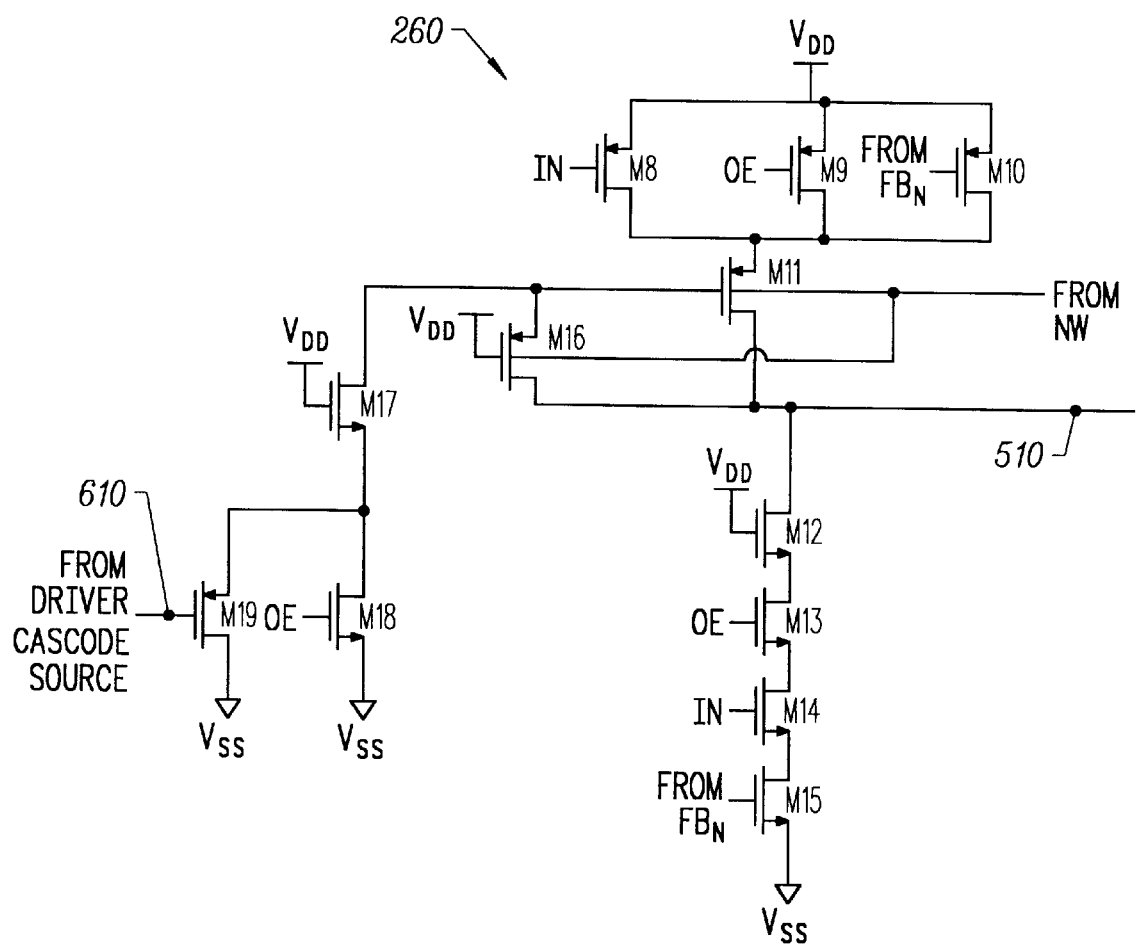
FIG. 6 is a schematic diagram of an embodiment of the pre-driver PMOS circuit of FIG. 4.

FIG. 6 is a schematic diagram of an embodiment of pre-driver PMOS circuit 260 of FIG. 4. Pre-driver PMOS circuit 260 provides a control signal to driver PMOS circuit 210. Pre-driver PMOS circuit 260 includes a pull-up circuit. In this specific embodiment, the pull-up circuit includes three transistors M8, M9, and M10 coupled in parallel between VDD and a transistor M11. Transistors M8, M9, and M10 couple in series with transistor M11 which couples to pre-driver PMOS signal node 510. In this specific embodiment, transistors M8, M9, M10, and M11 are PMOS transistors. The control inputs, or gates, of transistors M8, M9, and M10 are configured to receive input signal IN, output enable signal OE, and a feedback NMOS signal FBN, respectively. (Transistor M11 is described in more detail later.)

Pre-driver PMOS circuit 260 also includes a pull-down circuit. In this specific embodiment, the pull-down circuit includes four transistors M12, M13, M14, and M15 coupled in series between pre-driver PMOS signal node 510 and VSS. In this specific embodiment, transistors M12, M13, M14, and M15 are NMOS transistors. Transistors M13, M14, and M15 are configured to receive output enable signal OE, input signal IN, and feedback signal FBN, respectively. The control signal of transistor M12 couples to VDD.

Pre-driver PMOS circuit 260 also includes a pre-driver biasing circuit, or high-voltage protection circuitry, which further includes a plurality of transistors coupled to N-well NW. The transistors of the pre-driver biasing circuit are shown integrated into pre-driver PMOS circuit. In this specific embodiment, the pre-driver biasing circuit includes four transistors M16, M17, M18, and M19. Transistor M16 couples between the gate and drain of transistor M11. The gate of transistor M16 couples to VDD. Transistor M17 couples between the gate of transistor M11 and transistor M18. Transistor M17 couples in series with transistor M18. The gate of transistor M17 couples to VDD. Transistors M18 and M19 couple in parallel between transistor M17 and VSS. In this specific embodiment, transistors M16 and M19 are PMOS transistors and transistors M17 and M18 are NMOS transistors. The gate of transistor M19 couples to a driver_cascade_source node 610 (see also FIG. 4).

In operation, pre-driver PMOS circuit 260 is described in two modes, output mode (or normal mode) and input mode (or tri-state mode). In output mode, the pre-driver PMOS circuit 260 resembles a NAND gate. This is clear from looking at the circuit. The following description is of the input mode operation.

In this specific embodiment, transistor M12 acts as a pass transistor and allows only voltages less than VDD-VTN to propagate to transistors M13, M14, M15. (VTN is the threshold voltage of the transistor.) Transistor M12 is typically on because its gate is biased to VDD.

Likewise, pre-driver biasing circuit protects, or shields, transistors M8, M9, and M10 from high-voltages. High-voltages typically occur during input mode, when I/O node 130 (FIG. 4) is subjected to high-voltage. As said, the high-voltage is propagated from the I/O node 130 to pre-driver PMOS circuit 260 via pre-driver PMOS signal node 510.

Specifically, in both input and output modes, and under normal voltage conditions, transistor M11 turns on, allowing transistor M8, M9 and M10 to operatively couple to pre-driver PMOS signal node 510. For instance, in output mode, output enable signal OE is at a logic high (=VDD) and transistor M18 turns on. Transistor M17 is also on because its gate is tied to VDD. Accordingly, transistor M18 pulls the gate of transistor M11 low, thus turning it on. In input mode, signal OE is at a logic low (=VSS), turning transistor M18 off. When the voltage at I/O node 130 is at a logic low (VSS), driver_cascade_source node 610 (see also FIG. 4) is also low, pulling the gate of transistor M19 low. Transistor M19 then turns on. Accordingly, transistor M19 pulls the gate of transistor M11 low, thus turning it on.

While in input mode, when the I/O node 130 voltage transitions from a high to low voltage, the voltage at pre-driver PMOS signal node 510 can drift down. PMOS transistor M9 is on because signal OE is at a logic low. As a result, node 510 is charged by VDD through transistors M9 and M11, and thus maintains a voltage substantially close to VDD.

While still in input mode, and when a high-voltage (>VDD) appears at I/O node 130, the high-voltage propagates through node 510 of driver PMOS circuit 260. The pre-driver biasing circuit decouples transistors M8, M9 and M10 from pre-driver signal node 510. In this specific embodiment, PMOS transistor M16 turns-on when the voltage of the gate bus (source of transistor M16) is at a PMOS threshold above VDD (at gate of transistor M16). This shorts the source and gate of transistor M11, thus, turning it off. Accordingly, this prevents current leakage from the high-voltage to the supply voltage.

Pre-Driver NMOS Circuit

Referring back to FIG. 4, pre-driver NMOS circuit 270 resembles a NOR gate. It provides control signals to driver NMOS circuit 220. In this specific embodiment, transistors M20, M21, and M22 couple in series between VDD and a pre-driver NMOS signal node 520. The control inputs, or gates, of transistors M20, M21, and M22 are configured to receive a feedback PMOS signal FBP, signal IN, and signal OE compliment, respectively. Transistors M23, M24 and M25 couple in parallel between pre-driver NMOS signal node 520 and VSS. The gates of transistors M23, M24, and M25 are configured to receive signals IN, OE compliment, and FBP, respectively. In this specific embodiment, transistors M20, M21 and M22 are PMOS transistors, and transistors M23, M24, and M25 are NMOS transistors.

Feedback Circuits

Still referring to FIG. 4, buffer circuit 150 also includes feedback circuits to ensure that the driver circuits are not conducting simultaneously. As said, simultaneous conduction of these circuits is not desired, because it increases power dissipation in the circuit. As shown, PMOS feedback circuit 280 couples between pre-driver PMOS signal node 510 and the gates of transistors M20 and M25 to provide signal FBP. In this specific embodiment, an NMOS transistor M26 couples between pre-driver PMOS signal node 510 and an input of an inverter I1. The gate of transistor M26 couples to VDD. An output of inverter I1 couples to the gates of transistors M20 and M25. A PMOS transistor M27 couples between VDD and an input if inverter I1. The gate of transistor M27 couples to an output of inverter I1.

As shown, an NMOS feedback circuit 290 couples between the pre-driver NMOS signal node 520 and the gates of transistors M15 and M10 for providing a feedback NMOS signal FBN. In a specific embodiment, NMOS feedback circuit is an inverter I2. An input of inverter I2 couples to pre-driver NMOS signal node 520, and an output of inverter I2 couples to the gates of transistors M15 and M10.

In operation, when pre-driver NMOS signal node 520 is high, driver NMOS circuit accordingly turns on. Also, signal FBN at the output of inverter I2 is low, turning NMOS transistor M15 off and PMOS transistor M10 on. As a result, pre-driver PMOS signal node 510 is pulled to VDD, or at a logic high, thus keeping driver PMOS circuit 210 off. In other words, when driver NMOS circuit 220 is on, NMOS feedback circuit 290 keeps driver PMOS circuit 210 off.

Likewise, when pre-driver PMOS signal node 510 is low, driver PMOS circuit accordingly turns on. Also, signal FBP at the output of inverter I1 is at a logic high, thus turning transistor M20 off and transistor M25 on. As a result, pre-driver NMOS signal node 520 is pulled to VSS, or at a logic low, thus keeping driver NMOS circuit 220 off. In other words, when driver PMOS circuit 210 is on, PMOS feedback circuit 280 keeps driver NMOS circuit 220 off.

Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. An integrated circuit buffer comprising:
   a first driver circuit for sourcing current to an input/output node, the first driver circuit being coupled to a VDD voltage source;
   a second driver circuit for sinking current from the input/output node, the second driver circuit being coupled to a VSS voltage source;
   a first pre-driver circuit configured for providing a first pre-driver control signal to the first driver circuit, the first pre-driver circuit being coupled to the VDD and VSS voltage sources; and
   a second pre-driver circuit configured for providing a second pre-driver control signal to the second driver circuit, the second pre-driver circuit being coupled to the VDD and VSS voltage sources;
   wherein the first pre-driver circuit comprises:
      a pull-up circuit comprising a plurality of PMOS transistors coupled in parallel, the transistors having their source nodes coupled to the VDD voltage source and their control nodes configured to receive at least a first input signal;
      a PMOS switch transistor coupled between the pull-up circuit and a signal node, and having a control node;
      a biasing circuit comprising a PMOS first biasing transistor coupled between the control node of the PMOS switch transistor and the input voltage source, a control node of the PMOS first biasing transistor being coupled to the VDD voltage source; and
      a pull-down circuit comprising a plurality of NMOS transistors coupled in series between the input voltage source and the VSS voltage source;
   wherein the biasing circuit responds to an input voltage from the input voltage source such that when an input voltage from the input voltage source exceeds the VDD voltage by a threshold voltage, the biasing circuit causes the switch transistor to decouple the pull-up circuit from the signal node.

2. The integrated circuit of claim 1 further comprising a first feedback circuit and a second feedback circuit cross coupled between the first and second pre-driver circuits.

3. The integrated circuit of claim 2 wherein the first feedback circuit comprises:
   an NMOS transistor having a drain node coupled to a drain of the switch transistor, and a control node coupled to the VDD voltage source;
   an inverter having an input coupled to a source node of the NMOS transistor and an output coupled to the second pre-driver circuit; and
   a PMOS transistor having a source node coupled to the VDD voltage source, a drain node coupled to the input of the inverter, and a control node coupled to the output of the inverter.

4. The integrated circuit of claim 1 wherein the biasing circuit further comprises:
   a pass transistor coupled to the control node of the PMOS switch transistor, a control node of the pass transistor being coupled to the VDD voltage source;
   a second biasing transistor coupled between the pass transistor and the VSS voltage source, a control node of the second biasing transistor being configured to receive an enable signal; and
   a third biasing transistor coupled in parallel to the second biasing transistor, a control node of the third biasing transistor being configured to receive a second input signal.

5. The integrated circuit of claim 1 wherein VDD is substantially 3.6 volts and below.

6. The integrated circuit of claim 1 wherein the input voltage is a high voltage substantially 3.3 volts and above.

7. The integrated circuit of claim 1 wherein the input voltage is substantially 5.5 volts and below.

8. An integrated circuit buffer comprising:
   a first driver circuit for sourcing current to an input/output node, the first driver circuit being coupled to a VDD voltage source;

a second driver circuit for sinking current from the input/output node, the second driver circuit being coupled to a VSS voltage source;

a first pre-driver circuit configured for providing a first pre-driver control signal to the first driver circuit, the first pre-driver circuit being coupled to the VDD and VSS voltage sources;

a second pre-driver circuit configured for providing a second pre-driver control signal to the second driver circuit, the second pre-driver circuit being coupled to the VDD and VSS voltage sources; and a first feedback circuit and a second feedback circuit cross coupled between the first and second pre-driver circuits;

wherein the first driver circuit comprises:
  a pull-up circuit comprising a PMOS driver transistor which is coupled between the VDD voltage source and the input/output node; and
  a biasing circuit comprising a first biasing transistor and a second biasing transistor, the first and second biasing transistors being coupled in parallel between the VDD voltage source and an N-well, a control node of the first biasing transistor being coupled to the input/output node, a control node of the second biasing transistor being coupled to the control node of the PMOS driver transistor;

wherein the first feedback circuit comprises:
  an NMOS transistor having a drain node coupled to a drain of the switch transistor, a source node coupled to an input of an inverter, and a control node coupled to the VDD voltage source;
  an inverter having an input coupled to a source node of the NMOS transistor and an output coupled to the second pre-driver circuit; and
  a PMOS transistor having a source node coupled to the VDD voltage source, a drain node coupled to the input of the inverter, and a control node coupled to the output of the inverter.

* * * * *